United States Patent
Pruden et al.

(10) Patent No.: US 8,166,357 B2
(45) Date of Patent: Apr. 24, 2012

(54) IMPLEMENTING LOGIC SECURITY FEATURE FOR DISABLING INTEGRATED CIRCUIT TEST PORTS ABILITY TO SCANOUT DATA

(75) Inventors: David Warren Pruden, Endwell, NY (US); Dennis Martin Rickert, Rochester, MN (US); Brian Andrew Schuelke, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1153 days.

(21) Appl. No.: 11/964,093

(22) Filed: Dec. 26, 2007

(65) Prior Publication Data
US 2009/0172819 A1 Jul. 2, 2009

(51) Int. Cl.
*G01R 31/28* (2006.01)

(52) U.S. Cl. .......... 714/726; 714/30; 714/727; 714/729; 714/734; 324/76.11; 726/26; 327/202; 327/365; 327/291; 365/201

(58) Field of Classification Search ............ 726/26
See application file for complete search history.

(56) References Cited

U.S. PATENT DOCUMENTS

| | | | | |
|---|---|---|---|---|
| 5,115,146 A | * | 5/1992 | McClure | 327/143 |
| 6,028,798 A | * | 2/2000 | Roohparvar | 365/201 |
| 7,724,022 B1 | * | 5/2010 | Deskin et al. | 326/8 |
| 2002/0046375 A1 | * | 4/2002 | Haroun et al. | 714/727 |
| 2002/0162065 A1 | * | 10/2002 | Kashiwagi | 714/726 |
| 2008/0250283 A1 | * | 10/2008 | Block et al. | 714/726 |

\* cited by examiner

*Primary Examiner* — Nathan Flynn
*Assistant Examiner* — Bryan Wright
(74) *Attorney, Agent, or Firm* — Joan Pennington

(57) ABSTRACT

A method and apparatus for implementing integrated circuit security features are provided to selectively disable testability features on an integrated circuit chip. A test disable logic circuit receives a test enable signal and responsive to the test enable signal set for a test mode, establishes a test mode and disables ASIC signals. Responsive to the test enable signal not being set, the ASIC signals are enabled for a functional mode and the testability features on the integrated circuit chip are disabled. When the functional mode is enabled, the test disable logic circuit prevents the test mode from being established while the integrated circuit chip is powered up.

6 Claims, 1 Drawing Sheet

IMPLEMENTING LOGIC SECURITY FEATURE FOR DISABLING INTEGRATED CIRCUIT TEST PORTS ABILITY TO SCANOUT DATA

FIELD OF THE INVENTION

The present invention relates generally to the data processing field, and more particularly, relates to a method and apparatus for implementing integrated circuit security feature logic to disable testability features on an integrated circuit chip.

DESCRIPTION OF THE RELATED ART

A need exists for an effective mechanism for implementing an integrated circuit security feature that effectively prevents access to critical data stored in the integrated circuit chip during functional operation of the integrated circuit chip.

A need exists for such mechanism that prevents the operation of an integrated circuit from being stopped at any point in time and having critical data stored in its latches from being scanned out using the test port.

It is desirable to provide such mechanism for implementing an integrated circuit security feature that does not permanently disable testing of the integrated circuit chip, and more specifically that enables appropriate testing of the integrated circuit chip in conjunction with enabling the enhanced integrated circuit security features.

SUMMARY OF THE INVENTION

Principal aspects of the present invention are to provide a method and apparatus for implementing integrated circuit security features to selectively disable testability features on an integrated circuit chip.

Other important aspects of the present invention are to provide such a method and apparatus for implementing integrated circuit security features to disable testability features on an integrated circuit chip during functional operation of the integrated circuit chip substantially without negative effect and that overcome many of the disadvantages of prior art arrangements.

In brief, a method and apparatus for implementing integrated circuit security features are provided to selectively disable testability features on an integrated circuit chip. A test disable logic circuit receives a test enable signal and responsive to the test enable signal set for a test mode, establishes a test mode and disables ASIC signals. Responsive to the test enable signal not being set, the ASIC signals are enabled for a functional mode and the testability features on the integrated circuit chip are disabled. When the functional mode is enabled, the test disable logic circuit prevents the test mode from being established while the integrated circuit chip is powered up.

In accordance with features of the invention, the test disable logic circuit prevents the integrated circuit from being stopped at any point in time and having critical data stored in its latches from being scanned out using a test port after the functional mode is enabled.

In accordance with features of the invention, the integrated circuit chip is testable when the circuit is powered up in the test mode and the enhanced security features do not affect base testability of the integrated circuit chip.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
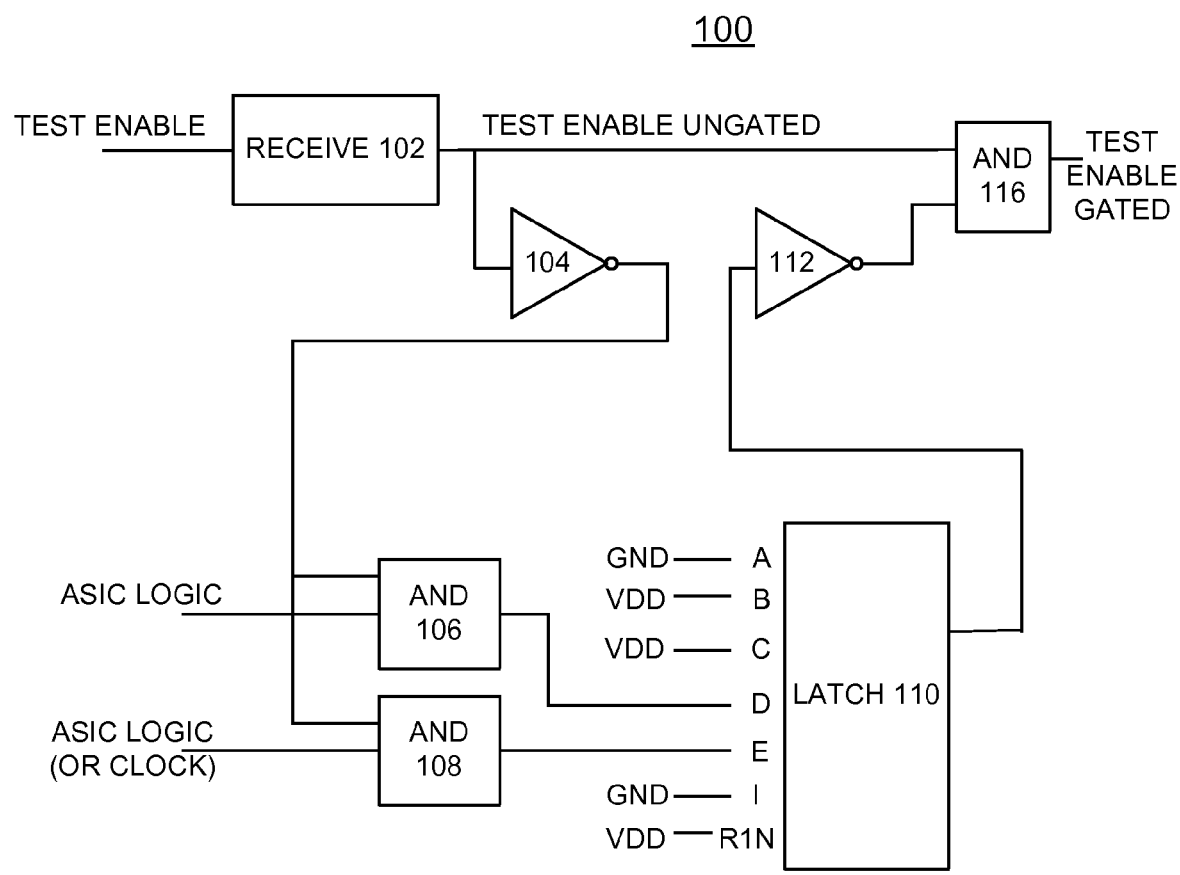
FIG. 1 is schematic and block diagram illustrating a test disable logic circuit for implementing integrated circuit security features in accordance with the preferred embodiment.

In accordance with features of the invention, a method and apparatus are provided to prevent the operation of an integrated circuit from being stopped at any point in time and having critical data stored in its latches from being scanned out using the test port.

Having reference now to the drawings, in FIG. 1, there is shown a test disable logic circuit for implementing integrated circuit security features generally designated by the reference character 100 in accordance with the preferred embodiment. Test disable logic circuit 100 includes a receive block 102 receiving a test enable signal TEST ENABLE and applying the test enable signal TEST ENABLE UNGATED to an inverter 104, which provides an inverted test enable signal.

Test disable logic circuit 100 includes a pair of AND gates 106, 108, each receiving an input of the inverted test enable signal from the inverter 104. As shown, AND gate 106 receives a second input of ASIC logic signal ASIC LOGIC, while AND gate 108 receives a second input of ASIC logic signal ASIC LOGIC or alternatively a clock signal. A latch 110 including a plurality of inputs A-E, I and R1N, receives the output of respective AND gates 106, 108 that are applied to predefined inputs D, E of the latch 110. The other inputs of the latch 110 are connected to known values of a ground potential GND, or a voltage supply rail VDD. The output of latch 110 is applied to an inverter 112. Test disable logic circuit 100 includes an AND gate 116 receiving an input of the test enable signal TEST ENABLE UNGATED and an input of the inverted latched output from inverter 112. The AND gate 116 provides an output signal TEST ENABLE GATED.

In operation of the test disable logic circuit 100, the normal or base testability of the integrated circuit chip is not affected by the enhanced security features provided. The integrated circuit chip is testable when the circuit is powered up in the test mode.

In operation of the test disable logic circuit 100, the latch 110 is designed to power-up to a known state of a logic level one, disabling AND gate 116 and enabling the test mode to be set with a logic level one for the test enable signal TEST ENABLE. The latch 110 automatically powers-up to the logic level one "1" state. The test mode is enabled only on power-up. After power-up, the functional state is established with the test enable signal TEST ENABLE set to a logic level zero. After the latch 110 is set to a logic level zero, changing the test enable signal TEST ENABLE will not change the output signal TEST ENABLE GATED of AND gate 116, which is held at zero, holding the functional mode and disabling the test mode.

In accordance with features of the invention, when the test enable signal TEST ENABLE is set, a test mode is established, and the ASIC signals are disabled in the test mode by AND gates 106 and 108. The ASIC signals cannot impact Test Enable during testing. Responsive to the test enable signal not being set or a logic level zero, then the ASIC signals are enabled for a functional mode and the testability features on the integrated circuit chip are disabled. The ASIC signals applied to the predefined inputs D, E of the latch 110 are provided to selectively set or reset the latch 110 in the functional mode when the test enable signal TEST ENABLE is zero.

In accordance with features of the invention, when the functional mode is enabled, the test disable logic circuit 100 prevents the test mode from being established while the integrated circuit chip is powered up. Then the output of AND gate 116 is a logic zero level, which holds the functional mode for the integrated circuit chip. Switching the test enable signal TEST ENABLE to a logic level one after the functional mode is enabled and the latch 110 is set would not change the output of AND gate 116 then a logic zero level, which holds the functional mode for the integrated circuit chip.

While the present invention has been described with reference to the details of the embodiments of the invention shown in the drawing, these details are not intended to limit the scope of the invention as claimed in the appended claims.

What is claimed is:

1. An apparatus for implementing integrated circuit security features to selectively disable testability features on an integrated circuit chip comprising:
   a test disable logic circuit receiving a test enable signal with the integrated circuit chip powering up to establish a test mode; said test disable logic circuit establishing said test mode and disabling ASIC signals responsive to the test enable signal set for said test mode; and
   said test disable logic circuit, enabling ASIC signals in a functional mode and disabling the testability features on the integrated circuit chip responsive to the test enable signal not being set for said functional mode;
   said test disable logic circuit includes a latch; said latch being reset on a power up state establishing said test mode; and said ASIC signals being disabled by a pair of input AND gates coupling an inverted test enable signal and said ASIC signals to said latch; and
   said latch being set for disabling the testability features on the integrated circuit chip and said ASIC signals being applied to respective inputs of said latch to selectively set or reset said latch responsive to the test enable signal not being set for said functional mode.

2. The apparatus for implementing integrated circuit security features as recited in claim 1 wherein the integrated circuit chip includes a test port, and wherein said test port is disabled preventing data stored in the integrated circuit from being scanned out using the test port after the functional mode is enabled.

3. The apparatus for implementing integrated circuit security features as recited in claim 1 wherein said test disable logic circuit includes an output AND gate for combining an output of said latch and said test enable signal.

4. A method for implementing integrated circuit security features to selectively disable testability features on an integrated circuit chip comprising the steps of:
   providing a test disable logic circuit receiving a test enable signal with the integrated circuit chip powering up to establish a test mode; establishing said test mode and disabling ASIC signals responsive to the test enable signal set for said test mode; and
   enabling ASIC signals in a functional mode and disabling the testability features on the integrated circuit chip responsive to the test enable signal not being set for said functional mode includes providing a latch;
   said latch being reset on a power up state establishing said test mode; and providing an output AND gate for combining an output of said latch and said test enable signal;
   providing a pair of input AND gates coupling an inverted test enable signal and said ASIC signals to said latch disabling said ASIC signals for said test mode;
   and said ASIC signals applied to said latch to selectively set or reset said latch responsive to the test enable signal not being set for said functional mode preventing critical data of the integrated circuit chip from being scanned out after the functional mode is enabled.

5. The method for implementing integrated circuit security features as recited in claim 4 wherein disabling the testability features on the integrated circuit chip responsive to the test enable signal not being set for said functional mode includes setting said latch enabling and holding the functional mode while the integrated circuit chip is powered up.

6. The method for implementing integrated circuit security features as recited in claim 4 wherein establishing a test mode includes enabling testability of the integrated circuit chip only when the integrated circuit chip is powered up in the test mode.

* * * * *